(12) United States Patent
Hsieh et al.

(10) Patent No.: US 10,679,915 B2
(45) Date of Patent: Jun. 9, 2020

(54) PACKAGE STRUCTURE AND MANUFACTURING METHOD THEREOF

(71) Applicant: Taiwan Semiconductor Manufacturing Co., Ltd., Hsinchu (TW)

(72) Inventors: Ping-Yin Hsieh, Hsinchu (TW); Chin-Fu Kao, Taipei (TW); Li-Hui Cheng, New Taipei (TW); Szu-Wei Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 40 days.

(21) Appl. No.: 16/172,836

(22) Filed: Oct. 28, 2018

(65) Prior Publication Data

US 2020/0135601 A1     Apr. 30, 2020

(51) Int. Cl.
| | | |
|---|---|---|
| H01L 23/02 | (2006.01) |
| H01L 23/31 | (2006.01) |
| H01L 25/18 | (2006.01) |
| H01L 21/56 | (2006.01) |
| H01L 23/532 | (2006.01) |
| H01L 23/00 | (2006.01) |
| H01L 21/82 | (2006.01) |

(52) U.S. Cl.
CPC ........ *H01L 23/3128* (2013.01); *H01L 21/566* (2013.01); *H01L 21/82* (2013.01); *H01L 23/5329* (2013.01); *H01L 24/09* (2013.01); *H01L 24/17* (2013.01); *H01L 24/32* (2013.01); *H01L 24/73* (2013.01); *H01L 24/97* (2013.01); *H01L 25/18* (2013.01); *H01L 2224/02373* (2013.01); *H01L 2224/02375* (2013.01)

(58) Field of Classification Search
CPC ... H01L 21/566; H01L 21/82; H01L 23/3128; H01L 23/5329; H01L 24/09; H01L 24/17; H01L 24/32; H01L 24/73; H01L 24/97; H01L 25/18
USPC .................................................. 257/678, 774
See application file for complete search history.

(56) References Cited

U.S. PATENT DOCUMENTS

| | | | |
|---|---|---|---|
| 8,354,304 B2 * | 1/2013 | Chow | H01L 21/561 257/774 |
| 8,361,842 B2 * | 1/2013 | Yu | H01L 21/561 257/E21.499 |
| 9,000,584 B2 | 4/2015 | Lin et al. | |
| 9,048,222 B2 * | 6/2015 | Hung | H01L 21/563 |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |

* cited by examiner

*Primary Examiner* — Brook Kebede
(74) *Attorney, Agent, or Firm* — JCIPRNET

(57) ABSTRACT

A package structure includes a plurality of first dies, a first encapsulant, and a first redistribution structure. The first encapsulant encapsulates the first dies. The first redistribution structure is disposed on the first dies and the first encapsulant. The first redistribution structure includes a dielectric layer covering a top surface and sidewalls of the first encapsulant.

20 Claims, 18 Drawing Sheets

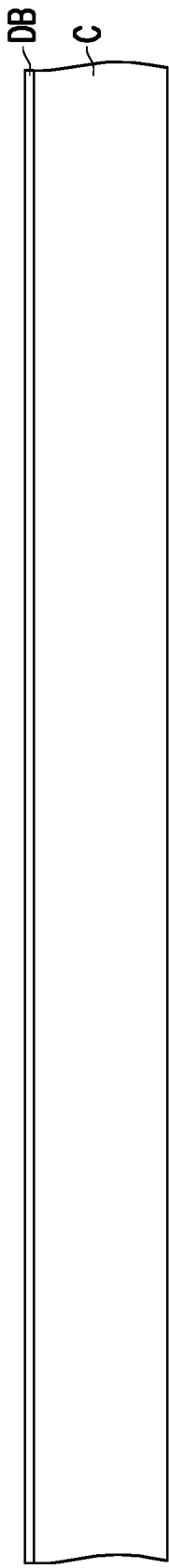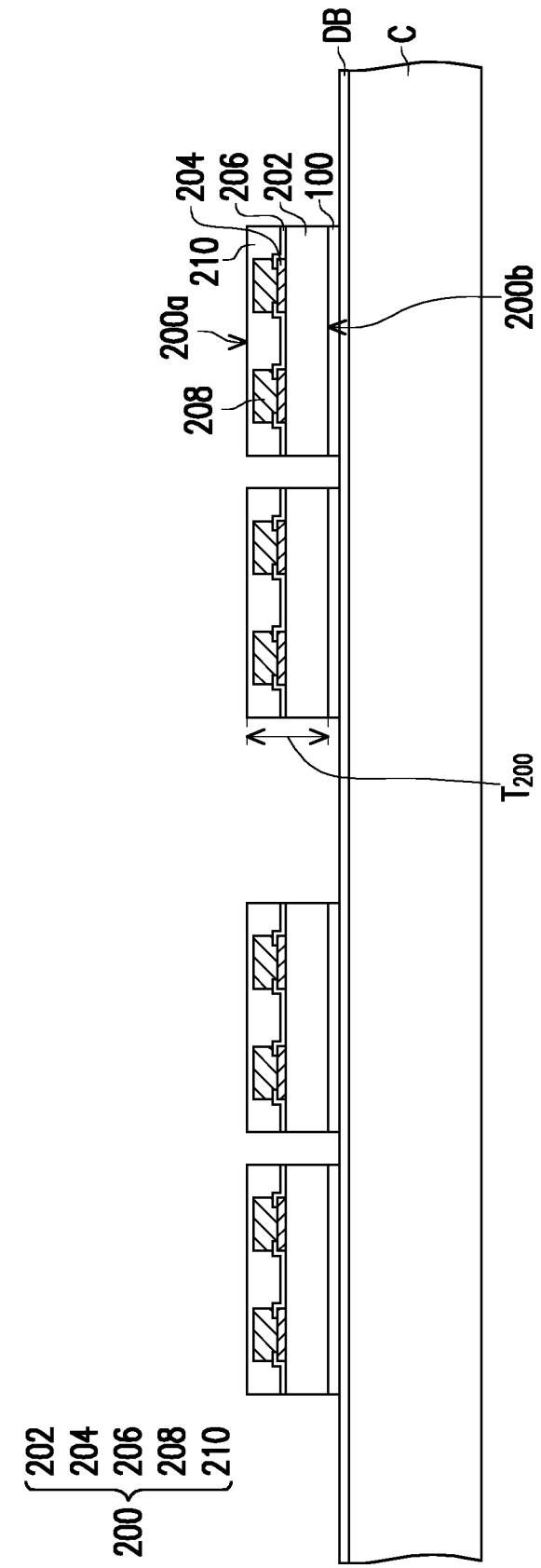

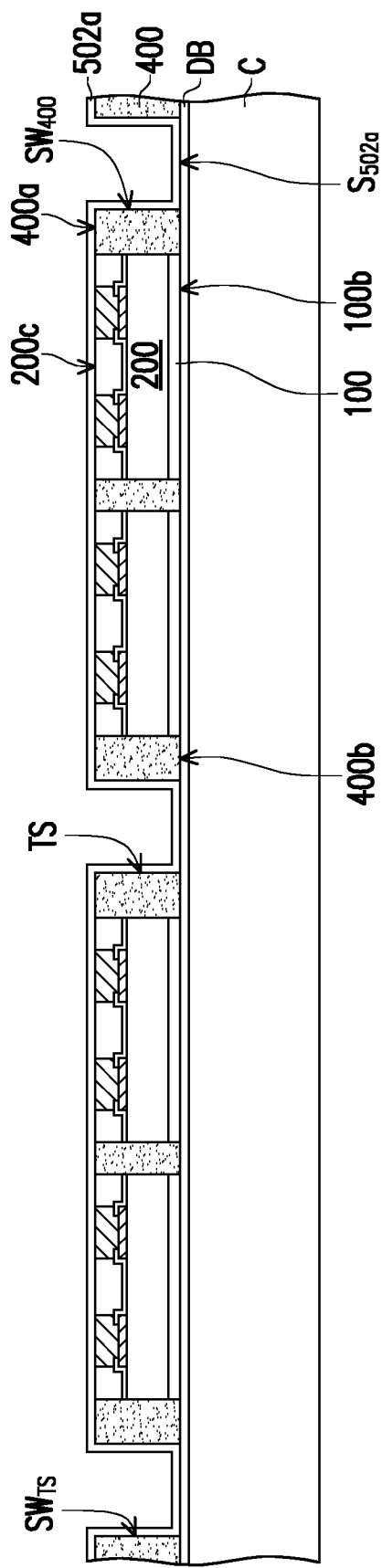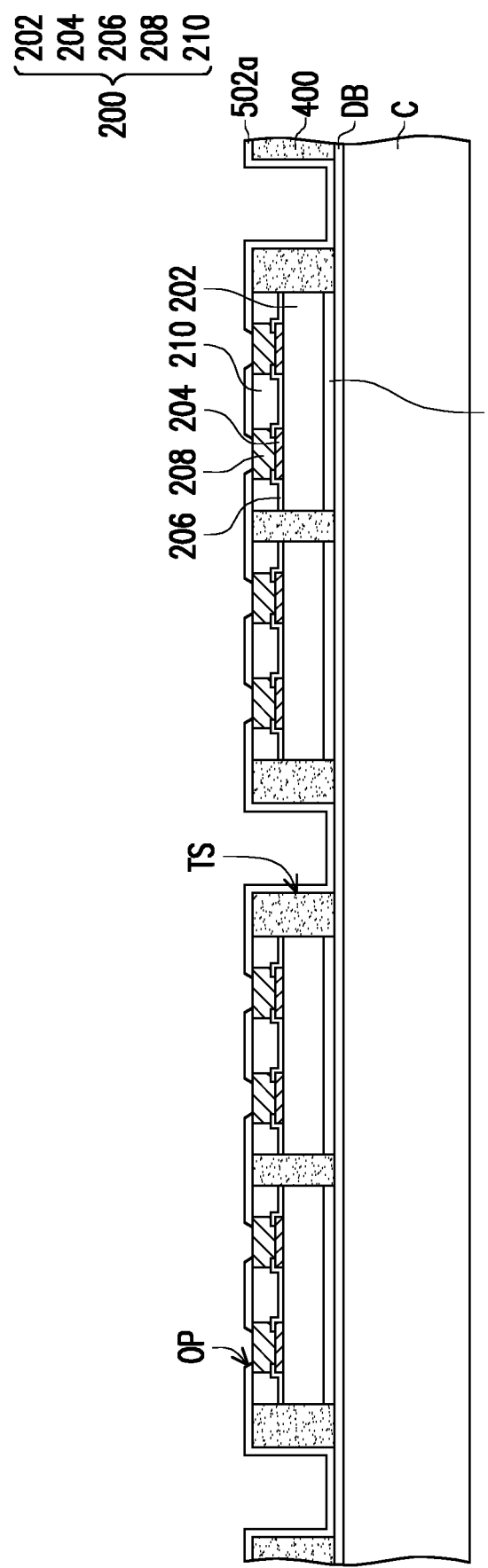

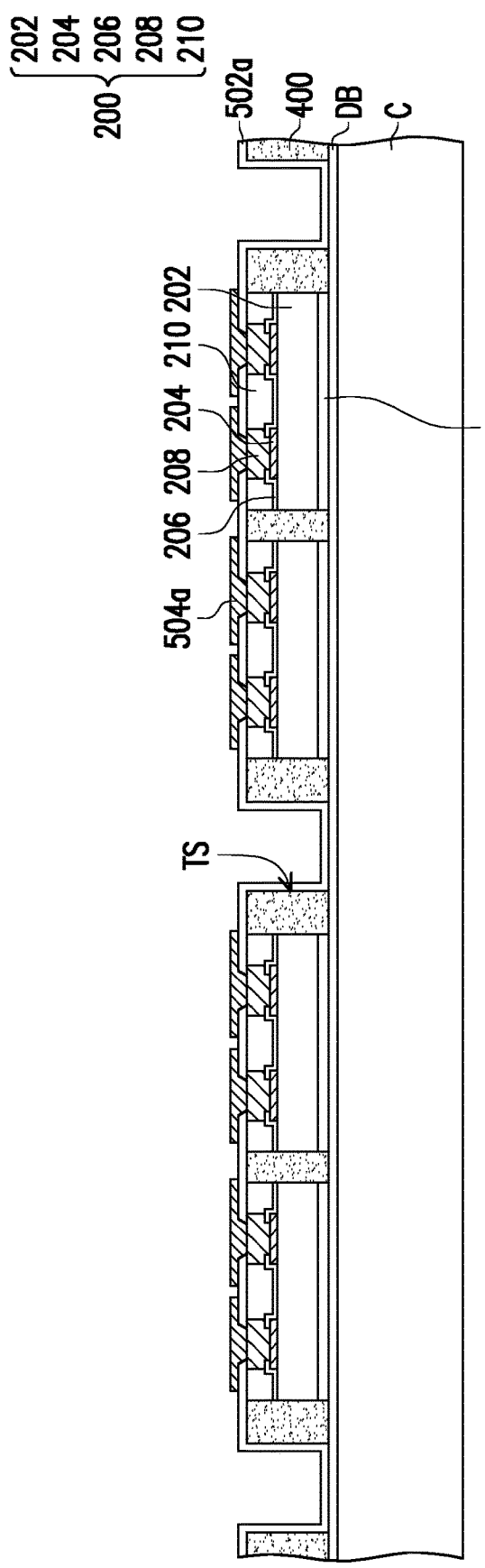
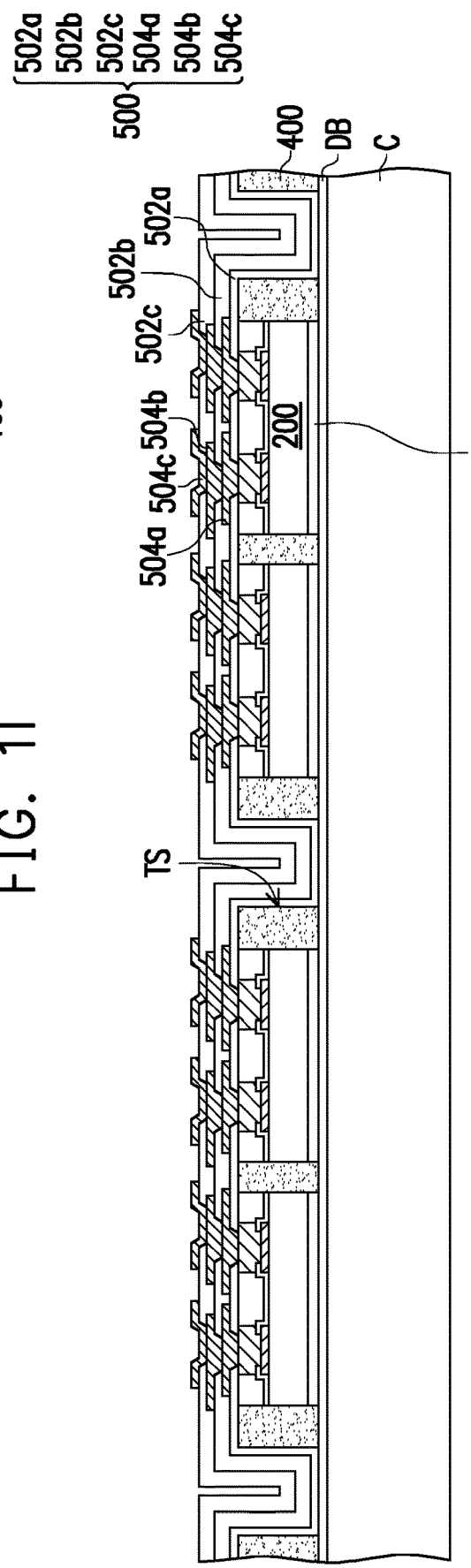
FIG. 1I
FIG. 1J

PACKAGE STRUCTURE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging. How to ensure the reliability of the wafer level packaging has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1C:
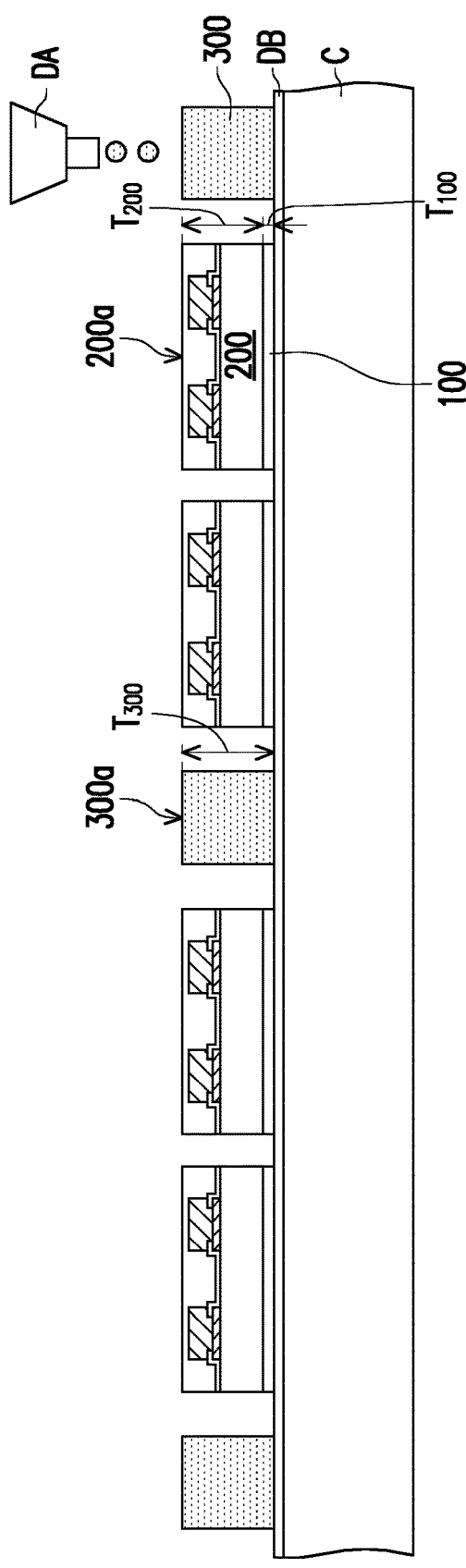
FIG. 1A to FIG. 1O are schematic cross-sectional views illustrating a manufacturing process of a package structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1O are schematic cross-sectional views illustrating a manufacturing process of a package structure 10 in accordance with some embodiments of the disclosure. Referring to FIG. 1A, a carrier C having a de-bonding layer DB formed thereon is provided. In some embodiments, the de-bonding layer DB is formed on a top surface of the carrier C. The carrier C is, for example, a glass substrate. In some embodiments, the de-bonding layer DB may be a light-to-heat conversion (LTHC) release layer formed on the glass substrate. In some alternative embodiments, the de-bonding layer DB may be a glue layer or a polymer-based buffer layer. However, the materials of the carrier C and the de-bonding layer DB listed above are merely for exemplary illustration, and the disclosure is not limited thereto. In some alternative embodiments, other materials may be adapted as the carrier C as long as the said material is able to withstand the subsequent process while carrying/supporting the subsequently formed elements. Similarly, other materials may be adapted as the de-bonding layer DB as long as the material is able to perform the release function in the subsequent processes.

Referring to FIG. 1B, a plurality of first dies 200 are placed over the carrier C and the de-bonding layer DB. In some embodiments, the first dies 200 are arranged in an array. In some embodiments, each first die 200 has a top surface 200a and a rear surface 200b opposite to the top surface 200a. As illustrated in FIG. 1B, the first dies 200 are placed such that the top surfaces 200a face upward while the rear surfaces 200b face the de-bonding layer DB. In some embodiments, the first dies 200 are placed over the de-bonding layer DB through a pick-and-place process. In some embodiments, each first die 200 may be a memory die (i.e. DRAM, SRAM, NVRAM, and/or the like), a logic die, a radio frequency (RF) die, or a processor die (i.e. accelerated processor (AP)). In some embodiments, a thickness $T_{200}$ of each first die 200 may range between 50 μm and 1000 μm. The configuration of each first die 200 will be described below.

In some embodiments, each first die 200 includes a semiconductor substrate 202, a plurality of conductive pads 204, a passivation layer 206, a plurality of conductive vias 208, and a protection layer 210. In some embodiments, the semiconductor substrate 202 may be a silicon substrate. In some alternative embodiments, the semiconductor substrate 202 may be made of a suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate 202 includes active components (e.g., transistors or the like) and passive components (e.g., resistors, capacitors, inductors, or the like) formed therein.

In some embodiments, the conductive pads 204 are distributed over the semiconductor substrate 202. The conductive pads 204 may be aluminum pads, copper pads, or other suitable metal pads. The passivation layer 206 is formed over the semiconductor substrate 202 and has contact openings partially exposing the conductive pads 204. The passivation layer 206 may be a silicon oxide layer, a silicon nitride layer, a silicon oxynitride layer, or a dielectric layer formed by other suitable dielectric materials. In some embodiments, a post-passivation layer (not shown) may be further formed over the passivation layer 206. In addition, the conductive vias 208 are formed on the conductive pads 204. In some embodiments, the conductive vias 208 are plated on the conductive pads 204 such that the conductive vias 208 are electrically connected to the conductive pads 204. The conductive vias 208 may be copper vias or other suitable metal vias. The protection layer 210 is formed on the passivation layer 206 to cover the conductive vias 208. In some embodiments, the protection layer 210 may be a polybenzoxazole (PBO) layer, a polyimide (PI) layer, or layers made of other suitable polymers. In some alternative embodiments, the protection layer 210 may be made of inorganic materials.

In some embodiments, the first dies 200 are adhered to the de-bonding layer DB through an adhesive layer 100. In some embodiments, the adhesive layer 100 is attached to the rear surfaces 200b of the first dies 200. For example, the semiconductor substrate 202 may be directly in contact with the adhesive layer 100 such that the adhesive layer 100 is sandwiched between the semiconductor substrate 202 and the de-bonding layer DB. In some embodiments, the adhesive layer 100 may include a die attach film (DAF). However, the disclosure is not limited thereto. In some alternative embodiments, other materials may be adapted as the adhesive layer 100 as long as the said material is able to strengthen the adhesion between the first dies 200 and the de-bonding layer DB.

Referring to FIG. 1C, a polymeric structure 300 is formed over the carrier C and the de-bonding layer DB. In some embodiments, the polymeric structure 300 is formed by inkjet printing. For example, the polymeric structure 300 may be formed by the following steps. First, polymeric ink in liquid form is dispensed by a dispensing apparatus DA on predetermined regions of the de-bonding layer DB. Subsequently, a curing process is performed to harden the polymeric ink, so as to form the polymeric structure 300. However, the disclosure is not limited thereto. In some alternative embodiments, the polymeric structure 300 may be formed by other suitable methods, such as three-dimensional printing, screen printing, or the like. In some embodiments, the polymeric structure 300 includes acrylic-based materials. For example, the polymeric structure 300 may be made of materials exhibiting similar properties as that of photoresist materials. The configuration of the polymeric structure 300 will be described below in conjunction with FIG. 2A.

Figure 2A:
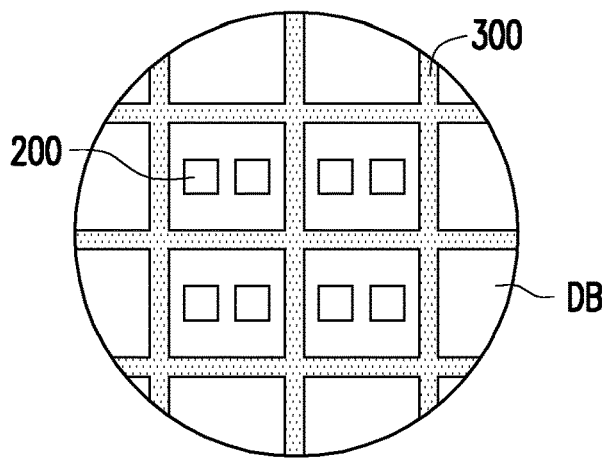
FIG. 2A is a schematic top view illustrating an intermediate stage of the manufacturing process of the package structure in FIG. 1C.

FIG. 2A is a schematic top view illustrating an intermediate stage of the manufacturing process of the package structure 10 in FIG. 1C. Referring to FIG. 1C and FIG. 2A, the polymeric structure 300 is formed to surround the first dies 200. For example, the polymeric structure 300 may form a grid pattern or a mesh pattern enclosing the first dies 200. Although the polymeric structure 300 is shown as a continuous grid pattern in FIG. 2A, the disclosure is not limited thereto. In some alternative embodiments, the polymeric structure 300 may include a plurality of discrete patterns encircling the first dies 200. In some embodiments, the polymeric structure 300 is formed to have a thickness $T_{300}$ greater than or equal to a sum of a thickness $T_{100}$ of the adhesive layer 100 and the thickness $T_{200}$ of the first die 200. In other words, a top surface 300a of the polymeric structure 300 is located at a level height higher than or substantially equal to a level height of the top surfaces 200a of the first dies 200.

Figure 1D:
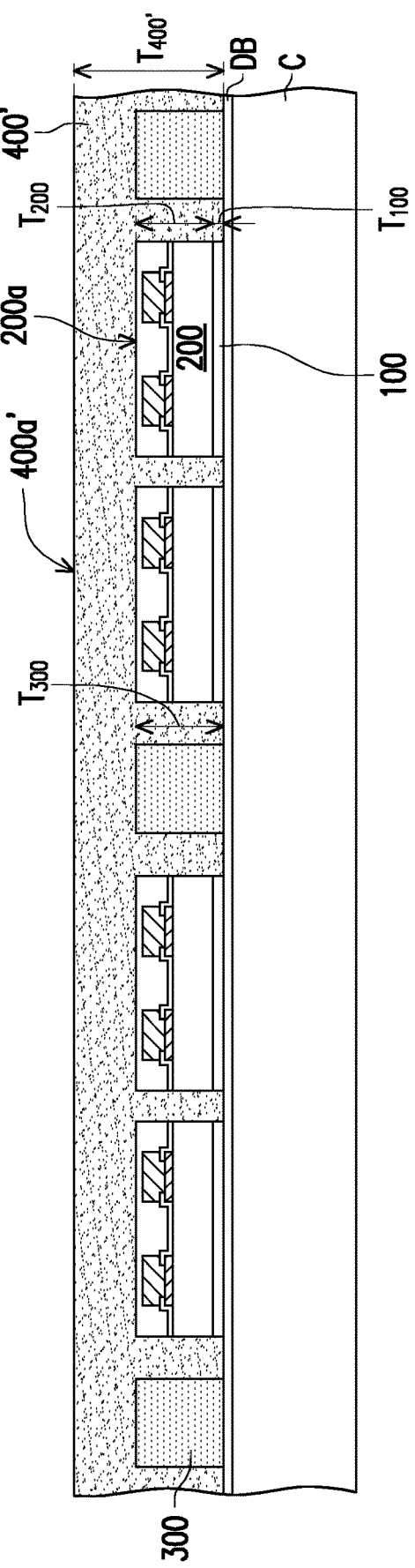

Referring to FIG. 1D, a first encapsulation material 400' is formed over the carrier C and the de-bonding layer DB to cover the adhesive layer 100, the first dies 200, and the polymeric structure 300. In some embodiments, the first encapsulation material 400' is a molding compound, a molding underfill, a resin (such as epoxy), or the like. In some embodiments, the first encapsulation material 400' includes fillers. The fillers may be particles made of silica, aluminum dioxide, or the like. The first encapsulation material 400' may be formed by a molding process, such as a compression molding process. In some embodiments, a thickness $T_{400'}$ of the first encapsulation material 400 is greater than the sum of the thickness $T_{100}$ of the adhesive layer 100 and the thickness $T_{200}$ of the first die 200. On the other hand, the thickness $T_{400'}$ of the first encapsulation material 400 is also greater than the thickness $T_{300}$ of the polymeric structure 300. For example, a top surface 400a' of the first encapsulation material 400' is located at a level height higher than the top surfaces 200a of the first dies 200 and the top surface 300a of the polymeric structure 300. In other words, the polymeric structure 300 and the first dies 200 are not revealed and are well protected by the first encapsulation material 400'.

Figure 1E:
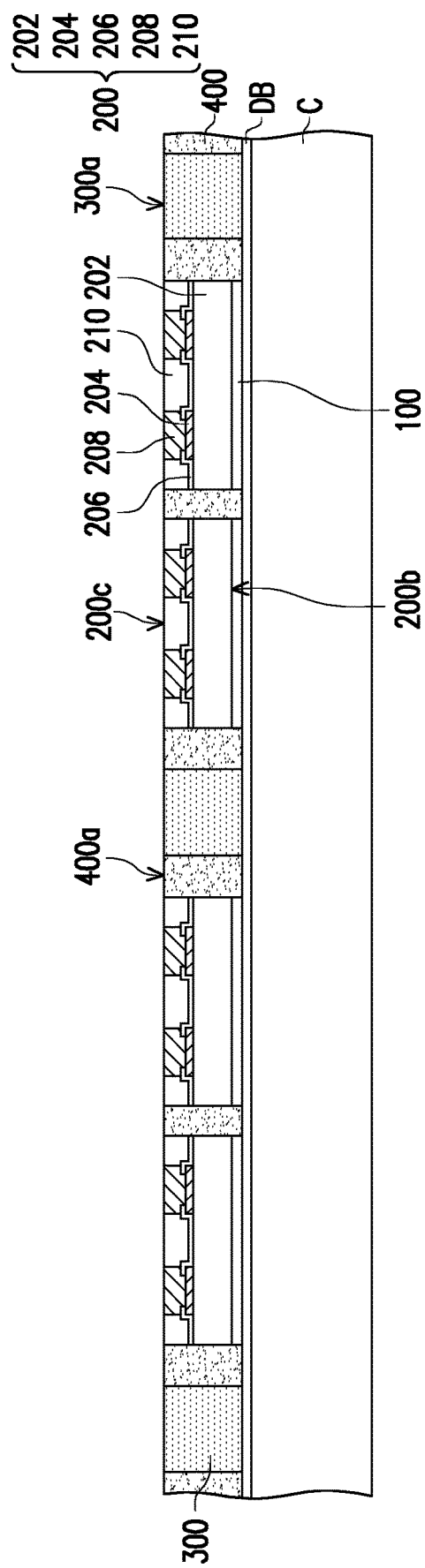

Referring to FIG. 1D and FIG. 1E, a portion of the first encapsulation material 400' is removed to expose the first dies 200 and the polymeric structure 300. For example, the first encapsulation material 400' and the protection layer 210 of the first dies 200 are grinded until the top surface 300a of the polymeric structure 300 and top surfaces of the conductive vias 208 of the first dies 200 are exposed. After the first encapsulation material 400' is grinded, an encapsulant 400 is formed over the de-bonding layer DB to encapsulate the first dies 200 and the polymeric structure 300. In some embodiments, the first encapsulation material 400' is grinded by a mechanical grinding process, a chemical mechanical polishing (CMP) process, or another suitable mechanism. In some embodiments, during the grinding process of the first encapsulation material 400' and the protection layer 210, portions of the polymeric structure 300 and/or portions of the conductive vias 208 may be slightly grinded as well. After grinding, each first die 200 has an active surface 200c opposite to the rear surface 200b. The exposed portion of the conductive vias 208 is located on the active surfaces 200c of the first dies 200. It is noted that the active surfaces 200c of the first dies 200, the top surface 300a of the polymeric structure 300, and a top surface 400a of the first encapsulant 400 are substantially coplanar.

Figure 2B:
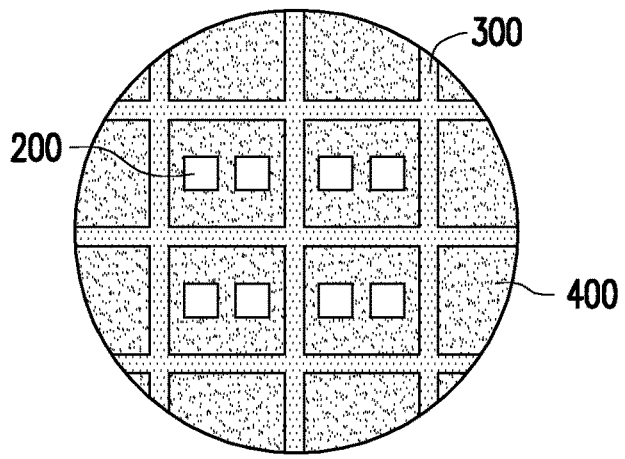
FIG. 2B is a schematic top view illustrating an intermediate stage of the manufacturing process of the package structure in FIG. 1E.

The relative configuration of the first encapsulant 400 and the polymeric structure 300 may be seen in FIG. 2B. FIG. 2B is a schematic top view illustrating an intermediate stage of the manufacturing process of the package structure 10 in FIG. 1E. Referring to FIG. 1E and FIG. 2B, the first encapsulant 400 encapsulates the first dies 200. On the other hand, the first encapsulant 400 is being divided into discontinuous patterns by the polymeric structure 300. In other words, the polymeric structure 300 serves as a partition structure for the first encapsulant 400.

Figure 1F:
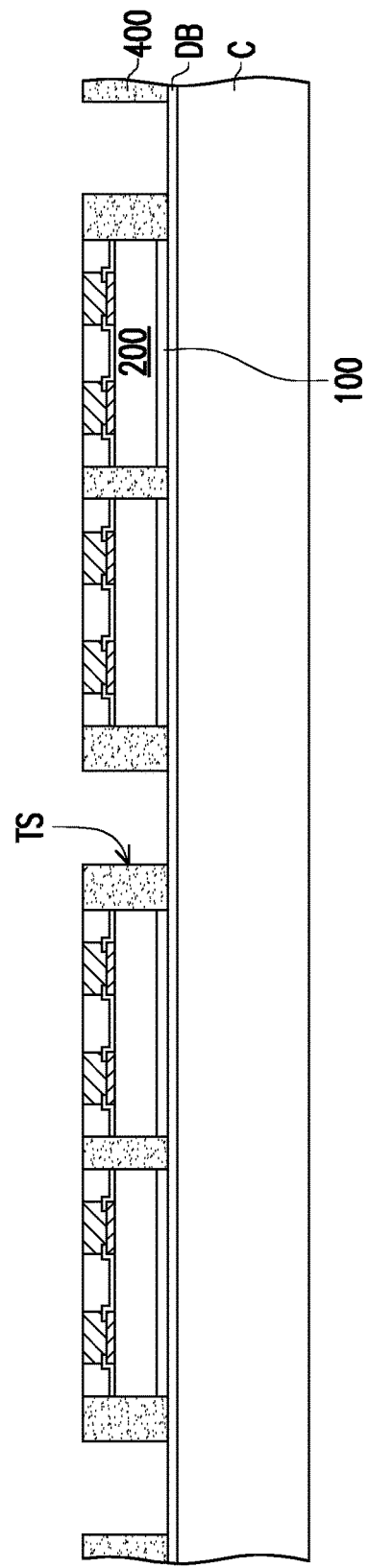

Referring to FIG. 1F, the polymeric structure 300 is removed to form a through slot TS in the first encapsulant 400. Upon removal of the polymeric structure 300, a portion of the de-bonding layer DB is exposed. In some embodiments, since the polymeric structure 300 is removed, the polymeric structure 300 may be referred to as a dummy structure. In some embodiments, the polymeric structure 300 is removed through an etching process or a laser drilling process. The etching process includes, for example, a wet etching process and/or a dry etching process. An etchant for the wet etching process includes alkali etchants. For example, when the polymeric structure 300 is removed through the wet etching process, sodium hydroxide (NaOH) aqueous solution may be adapted as an etchant. On the other hand, an etchant for the dry etching process includes fluorine-free gas. For example, when the polymeric structure 300 is removed through the dry etching process, oxygen plasma may be adapted as an etchant. In some embodiments, the through slot TS has substantially straight sidewalls. The profile of the through slot TS and the first encapsulant 400 will be described below in conjunction with FIG. 2C.

Figure 2C:
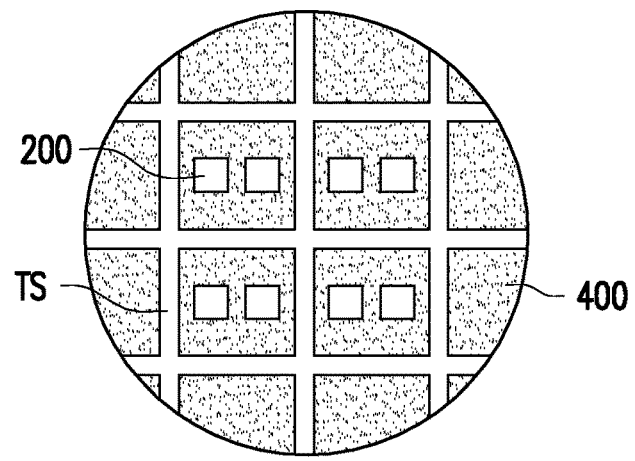
FIG. 2C is a schematic top view illustrating an intermediate stage of the manufacturing process of the package structure in FIG. 1F.

FIG. 2C is a schematic top view illustrating an intermediate stage of the manufacturing process of the package structure 10 in FIG. 1F. In some embodiments, since the through slot TS is formed by removing the polymeric structure 300, the through slot TS may have a contour substantially identical to the contour of the polymeric structure 300. Referring to FIG. 1F and FIG. 2C, the through slot TS surrounds the first dies 200 to form a grid. In some embodiments, the through slot TS separates the first encapsulant 400 into multiple discrete blocks arranged in an array. In other words, the first encapsulant 400 is discontinuous. In some embodiments, by adapting the discontinuous first encapsulant 400, warpage resulted from coefficient of thermal expansion (CTE) mismatch between the first encapsulant 400 and the carrier C may be sufficiently reduced. For example, the discontinuous first encapsulant 400 is able to release the stress through the through slot TS during the subsequent thermal processes, thereby sufficiently alleviating the warpage of the subsequently formed package structure. In other words, the process error derived from warpage may be sufficiently eliminated and the difficulty of the manufacturing process may be decreased. As a result, the yield of the package structure may be increased and the reliability of the package structure may be enhanced.

Although FIG. 1C to FIG. 1F depicted that the through slot TS is obtained by forming and removing the polymeric structure 300, the disclosure is not limited thereto. In some alternative embodiments, the step of forming the polymeric structure 300 may be omitted. In other words, in some alternative embodiments, the steps shown in FIG. 1C may be skipped and a continuous first encapsulant 400 may be blanketly formed over the de-bonding layer DB. Thereafter, a laser drilling process may be performed to remove a portion of the first encapsulant 400, so as to form the through slot TS in the first encapsulant 400.

Referring to FIG. 1G, a first dielectric layer 502a is formed over the first encapsulant 400 and the first dies 200. The first dielectric layer 502a covers the active surface 200c of the first dies 200, the top surface 400a of the first encapsulant 400, and sidewalls $SW_{400}$ of the first encapsulant 400. In some embodiments, the first dielectric layer 502a is conformally formed. For example, the first dielectric layer 502a extends from the active surface 200c of the first dies 200 and the top surface 400a of the first encapsulant 400 to inside of the through slot TS. As illustrated in FIG. 1G, the first dielectric layer 502a fills into the through slot TS of the first encapsulant 400 to cover sidewalls $SW_{TS}$ of the through slot TS and the de-bonding layer DB exposed by the through slot TS. On the other hand, a bottom surface 100b of the adhesive layer 100, a bottom surface 400b of the first encapsulant 400, and a portion of a bottom surface $S_{502a}$ of the first dielectric layer 502a are coplanar. In some embodiments, a material of the first dielectric layer 502a is different from the material of the first encapsulant 400. For example, the material of the first dielectric layer 502a includes polyimide, polybenzoxazole, epoxy-based material, or acrylic-based material. In some embodiments, the first dielectric layer 502a is free of filler. In some embodiments, the first dielectric layer 502a may be formed by suitable fabrication techniques such as chemical vapor deposition (CVD), plasma-enhanced chemical vapor deposition (PECVD), or the like.

Referring to FIG. 1H, the first dielectric layer 502a is patterned to form a plurality of openings OP. In some embodiments, the locations of the openings OP correspond to locations of the conductive vias 208 of the dies 200. That is, the openings OP of the first dielectric layer 502a at least partially expose the conductive vias 208 located underneath the first dielectric layer 502a. In some embodiments, the first dielectric layer 502a may be patterned through a photolithography process and an etching process.

Referring to FIG. 1I, a plurality of first redistribution conductive patterns 504a is formed over the first dielectric layer 502a. In some embodiments, the first redistribution conductive patterns 504a may be formed by the following steps. First, a seed material layer (not shown) is formed over the first dielectric layer 502a. In some embodiments, the seed material layer includes a titanium/copper composite layer and is formed by a sputtering process. Then, a mask pattern (not shown) having openings is formed on the seed material layer. The openings of the mask pattern expose the intended location for the subsequently formed first redistribution conductive patterns 504a. Afterwards, a plating process is performed to form a conductive material layer on the seed material layer exposed by the openings of the mask pattern. In some embodiments, a material of the conductive material layer includes aluminum, titanium, copper, nickel, tungsten, and/or alloys thereof. The mask pattern and the underlying seed material layer are then removed by a stripping process and an etching process. The remaining seed material layer and the remaining conductive material layer then constitute the first redistribution conductive patterns 504a. It should be noted that during the formation process of the first redistribution conductive patterns 504a, the mask pattern is filled into the through slot TS so the conductive patterns are not formed in the through slot TS.

Referring to FIG. 1J, after the first redistribution conductive patterns 504a are formed, the steps illustrated in FIG. 1G to FIG. 1I may be repeated several times to form a second dielectric layer 502b, a third dielectric layer 502c, a plurality of second redistribution conductive patterns 504b, and a plurality of third redistribution conductive patterns 504c. The second dielectric layer 502b is sandwiched between the first redistribution conductive patterns 504a and the second redistribution conductive patterns 504b. The third dielectric layer 502c is sandwiched between the second redistribution conductive patterns 504b and the third redistribution conductive patterns 504c. In some embodiments, materials of the second dielectric layer 502b and the third dielectric layer 502c may be the same as or different from the material of the first dielectric layer 502a. Similarly, materials of the second redistribution conductive patterns 504b and the third redistribution conductive patterns 504c may be the same as or different from the material of the first redistribution conductive patterns 504a. In some embodiments, the first dielectric layer 502a, the second dielectric layer 502b, the third dielectric layer 502c, the first redistribution conductive patterns 504a, the second redistribution conductive patterns 504b, and the third redistribution conductive patterns 504c constitute a redistribution structure 500. In other words, the redistribution structure 500 is formed over the first dies 200 and the first encapsulant 400.

In some embodiments, at least a portion of the redistribution structure 500 is filled into the through slot TS of the first encapsulant 400. As illustrated in FIG. 1J, the first redistribution conductive patterns 504a extend into the openings OP of the first dielectric layer 502a to be in physical contact with the top surfaces of the conductive via 208, so as to provide electrical connection between the redistribution structure 500 and the first dies 200. It should be noted that although three layers of the redistribution conductive patterns (the first redistribution conductive patterns 504a, the second redistribution conductive patterns 504b, and the third redistribution conductive patterns 504c) and three layers of the dielectric layers (the first dielectric layer 502a, the second dielectric layer 502b, and the third dielectric layer 502c) are illustrated in FIG. 1J, the number of these layers is not limited in the disclosure. In some alternative embodiments, the redistribution structure 500 may be constituted by more or less layers of the dielectric layer and the redistribution conductive patterns depending on the circuit design.

Figure 1K:
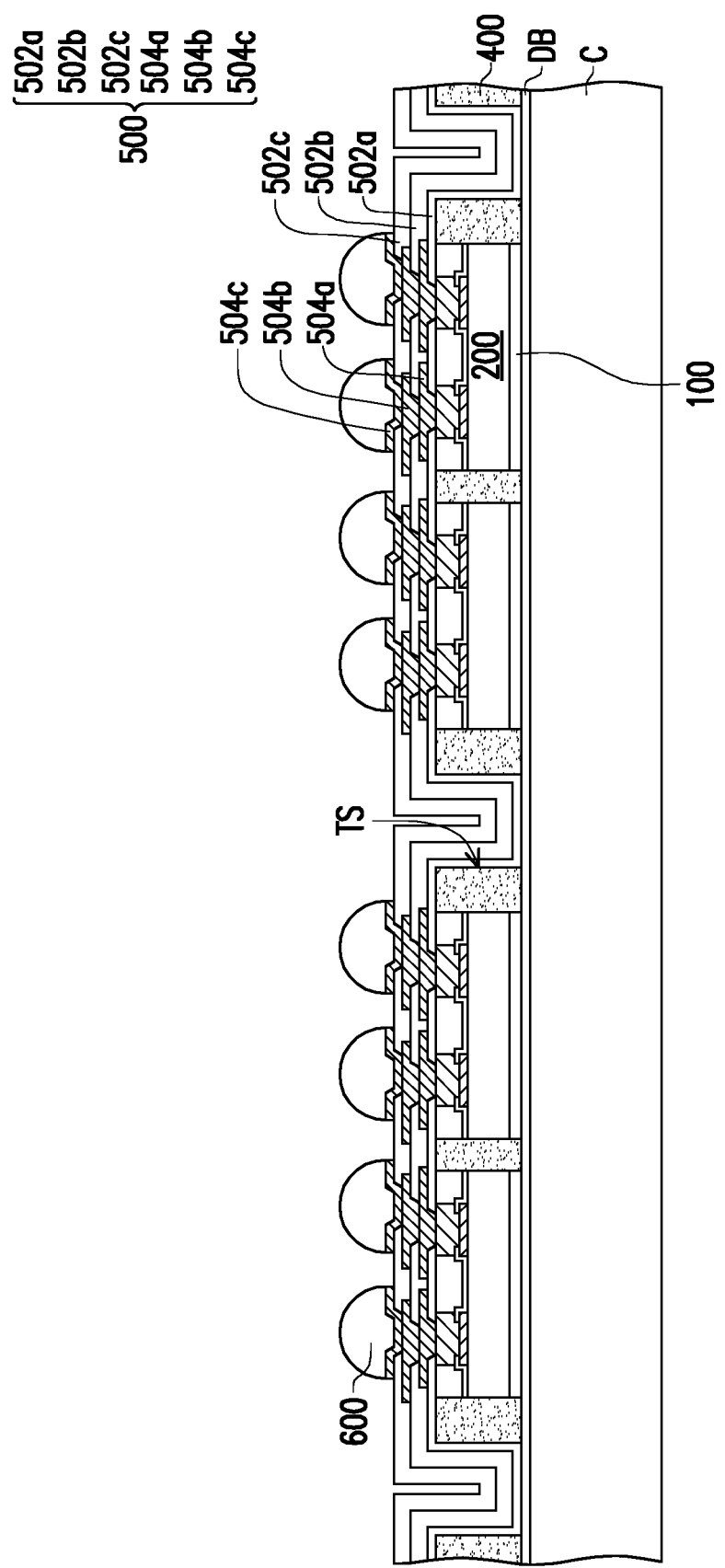

Referring to FIG. 1K, a plurality of conductive terminals 600 is formed over the redistribution structure 500. In some embodiments, the third redistribution conductive patterns 504c may include a plurality of under-ball metallurgy (UBM) patterns for ball mount. The conductive terminals 600 may be disposed over the UBM patterns. In some embodiments, the conductive terminals 600 are attached to the UBM patterns through a solder flux. In some embodiments, the conductive terminals 600 are, for example, solder balls. In some embodiments, the conductive terminals 600 may be disposed on the redistribution structure 500 through a ball placement process and/or a reflow process. In some embodiments, other than the conductive terminals 600, a plurality of passive device (not shown) may also be placed on the redistribution structure 500. For example, the third redistribution conductive patterns 504c may further include a plurality of connection pads for mounting passive components. The passive device includes, for example, resistors, capacitors, inductors, or the like. In some embodiments, the passive device may be electrically connected to the redistribution structure 500 through a plurality of solder joints disposed therebetween.

Figure 1L:
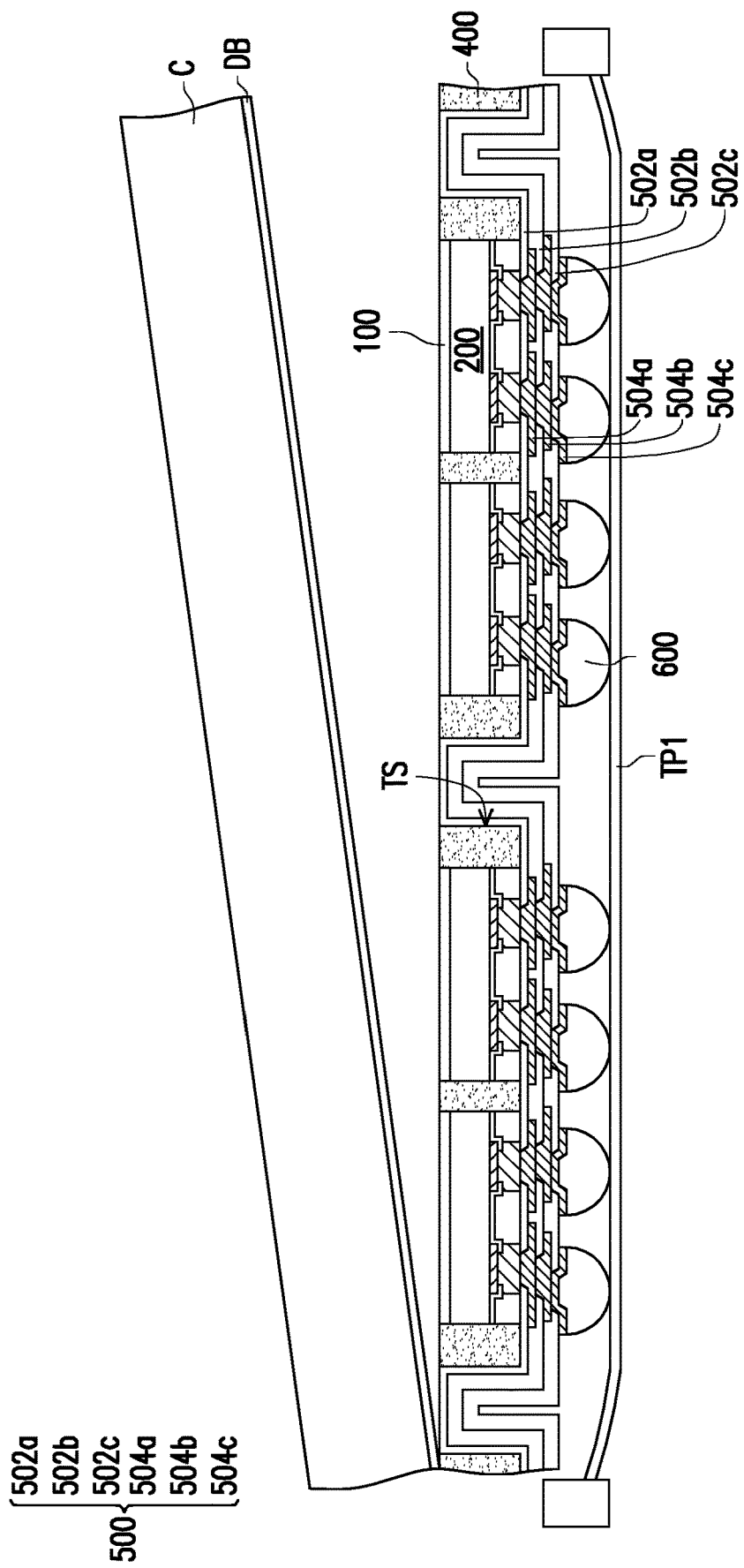

Referring to FIG. 1L, the structure illustrated in FIG. 1K is flipped upside down and is placed on a tape TP1. Subsequently, the carrier C and the de-bonding layer DB are removed from the adhesive layer 100, the first encapsulant 400, and the redistribution structure 500. In some embodiments, the de-bonding layer DB (e.g., the LTHC release layer) may be irradiated by an UV laser such that the carrier C and the de-bonding layer DB may be peeled off from the adhesive layer 100, the first encapsulant 400, and the first dielectric layer 502a of the redistribution structure 500. However, the de-bonding process is not limited thereto. Other suitable de-carrier methods may be used in some alternative embodiments.

Figure 1M:
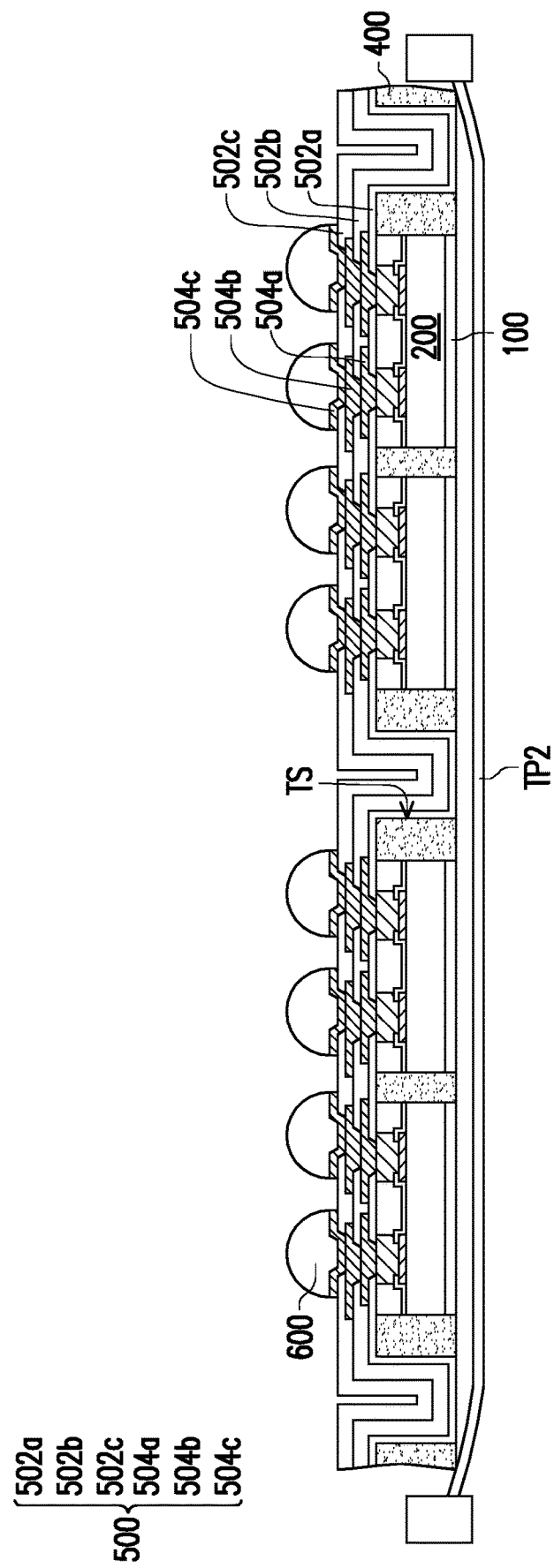

Referring to FIG. 1M, the structure illustrated in FIG. 1L is flipped upside down and is placed on a tape TP2 for further processing. For example, a cleaning process may be performed to remove impurities or residues derived from previous process steps.

Figure 1N:
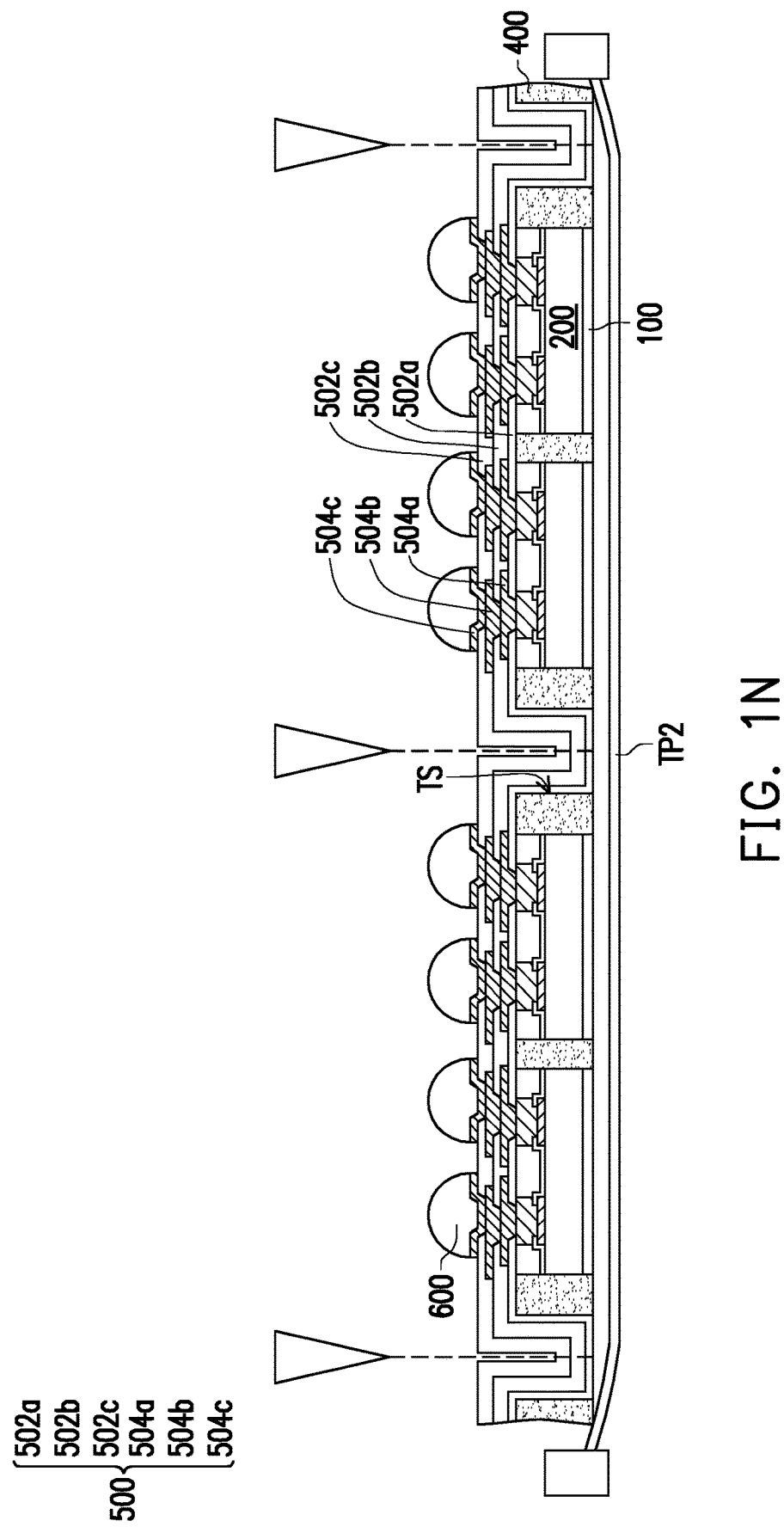
Figure 10:
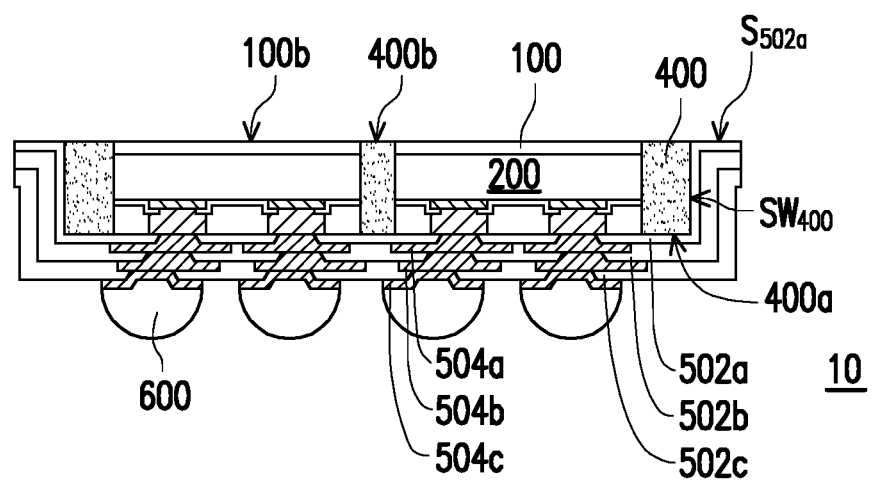

Referring to FIG. 1N, a singulation process is performed. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, the scribe line for singulation may be located within the through slot TS of the first encapsulant 400. For example, during the singulation process, the rotating blade or the laser beam may cut through the first dielectric layer 502a, the second dielectric layer 502b, and the third dielectric layer 502c located in the through slot TS. Although FIG. 1N illustrated that the dicing is performed at the center of the through slot TS, the disclosure is not limited thereto. In some alternative embodiments, the dicing may be performed at any position located between one sidewall of the through slot TS and the center of the through slot TS.

Referring to FIG. 1O, after the singulation process, a plurality of package structures 10 are obtained. As illustrated in FIG. 1O, the first dielectric layer 502a is directly in contact with the first encapsulant 400 and covers top surface 400a and sidewalls $SW_{400}$ of the first encapsulant 400. Furthermore, the bottom surface of the first encapsulant 400, the bottom surface 100b of the adhesive layer 100, and a portion of the bottom surface $S_{502a}$ of the first dielectric layer 502 are coplanar with each other. In some embodiments, the redistribution structure 500 forms a tail-like profile at two edges of the package structure 10. In some embodiments, the package structure 10 may be referred to as an integrated fan-out (InFO) package.

Figure 3A:
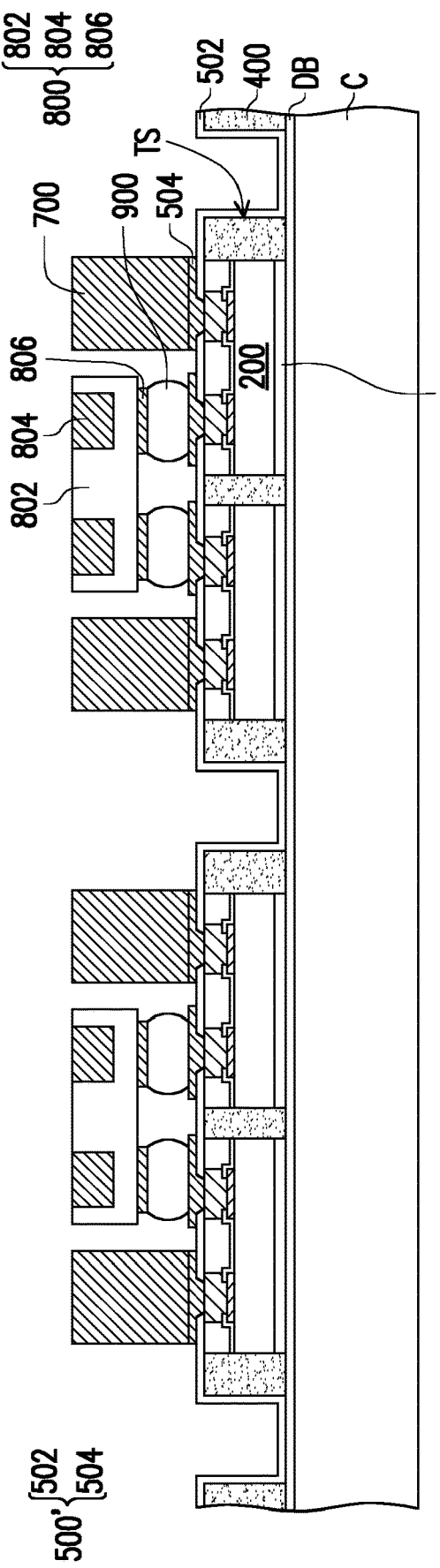
FIG. 3A to FIG. 3H are schematic cross-sectional views illustrating a manufacturing process of a package structure in accordance with some alternative embodiments of the disclosure.

FIG. 3A to FIG. 3H are schematic cross-sectional views illustrating a manufacturing process of a package structure 20 in accordance with some alternative embodiments of the disclosure. Referring to FIG. 3A, the structure illustrated in FIG. 1I is provided. Unlike the package structure 10 of FIG. 1O, the steps illustrated in FIG. 1G to FIG. 1I are not repeated. In other words, as illustrated in FIG. 3A, a first redistribution structure 500' is constituted by one layer of dielectric layer 502 and one layer of redistribution conductive patterns 504. The configurations and the formation methods of the dielectric layer 502 and the redistribution conductive patterns 504 in FIG. 3A are respectively similar to the first dielectric layer 502a and the first redistribution conductive patterns 504a in FIG. 1I, so the detailed descriptions thereof are omitted herein.

As illustrated in FIG. 3A, a plurality of conductive structures 700 and a plurality of second dies 800 are formed over the first redistribution structure 500'. In some embodiments, the conductive structures 700 are disposed on some of the redistribution conductive patterns 504. In other words, the conductive structures 700 are electrically connected to the first redistribution structure 500'. In some embodiments, the conductive structures 700 may be pre-formed and may be transferred onto the first redistribution structure 500' through pasting. For example, a conductive layer may be blanketly formed on a carrier (not shown). Subsequently, the conductive layer may be patterned to form the conductive structures 700. Thereafter, the carrier having the conductive structures 700 formed thereon may be flipped. The flipped structure may be brought to come into close contact with the first redistribution structure 500' such that the conductive structures 700 are transferred onto the first redistribution structure 500'. Then, the carrier is removed to obtain the conductive structures 700 standing on the redistribution conductive patterns 504. However, the disclosure is not limited thereto. In some alternative embodiments, the pre-fabricated conductive structures 700 may be picked and placed onto the redistribution conductive patterns 504. In some alternative embodiments, the conductive structures 700 may be formed on the redistribution conductive patterns 504 through electro-plating, electroless-plating, immersion plating, or the like. In some embodiments, a material of the conductive structures 700 includes aluminum, titanium, copper, nickel, tungsten, and/or alloys thereof.

In some embodiments, the second dies 800 are placed on the rest of the redistribution conductive patterns 504. For example, the second dies 800 are disposed such that the conductive structures 700 surround the second dies 800. In some embodiments, each second die 800 includes a semiconductor substrate 802, a plurality of conductive pads 804, and a plurality of connectors 806. In some embodiments, the semiconductor substrate 802 may be a silicon substrate. In some alternative embodiments, the semiconductor substrate 802 may be made of a suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate 802 includes active components (e.g., transistors or the like) and passive components (e.g., resistors, capacitors, inductors, or the like) formed therein.

In some embodiments, the conductive pads 804 and the conductive connectors 806 are distributed on opposite sides of the semiconductor substrate 802. A material of the conductive pads 804 and the conductive connectors 806 may include aluminum, copper, or other suitable metal. It should be noted that the configuration of the second dies 800 shown in FIG. 3A merely serves as an exemplary illustration, and the disclosure is not limited thereto. In some alternative embodiments, the second dies 800 may include additional components or the configuration of the second dies 800 may be similar to the first dies 200 illustrated in FIG. 1B. In some embodiments, each second die 800 may be a memory die (i.e. DRAM, SRAM, NVRAM, and/or the like), a logic die, a radio frequency (RF) die, or a processor die (i.e. accelerated processor (AP)).

In some embodiments, the second dies 800 are electrically connected to the first redistribution structure 500' through a plurality of joint terminals 900. For example, the joint terminals 900 are sandwiched between the conductive connectors 806 and the redistribution conductive patterns 504 to render electrical connection between the second dies 800 and the first redistribution structure 500'. In some embodiments, the joint terminals 900 are solder joints formed by a ball placement process and/or a reflowing process.

Figure 3B:
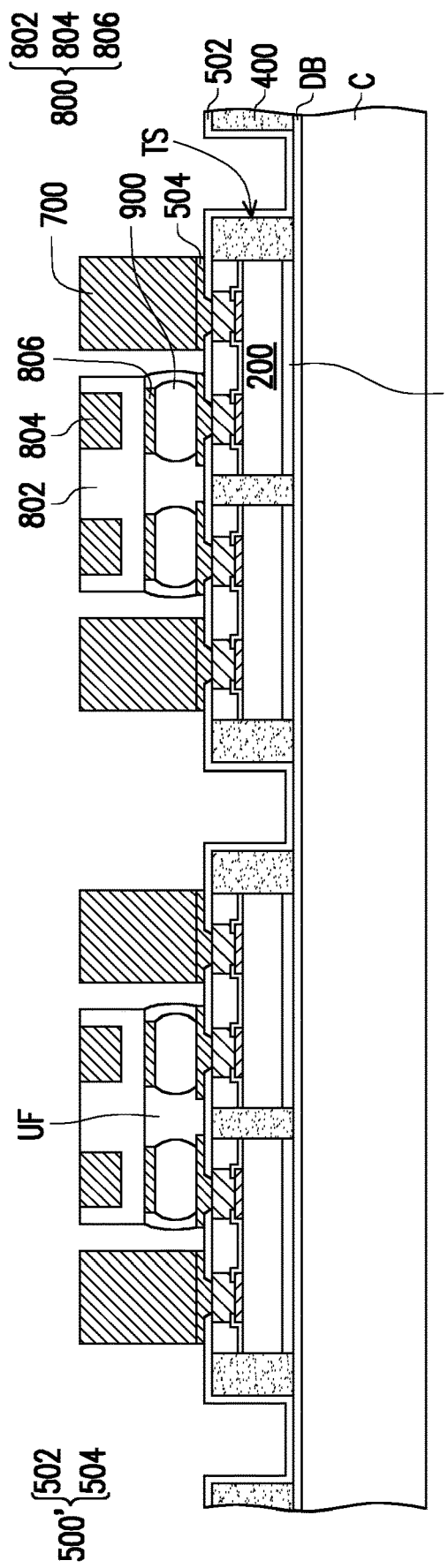

Referring to FIG. 3B, an underfill layer UF is formed between the second dies 200 and the first redistribution structure 500'. For example, the underfill layer UF may be formed to wrap around the conductive connectors 806, the joint terminals 900, and some of the redistribution conductive patterns 504 to protect these elements.

Figure 3C:
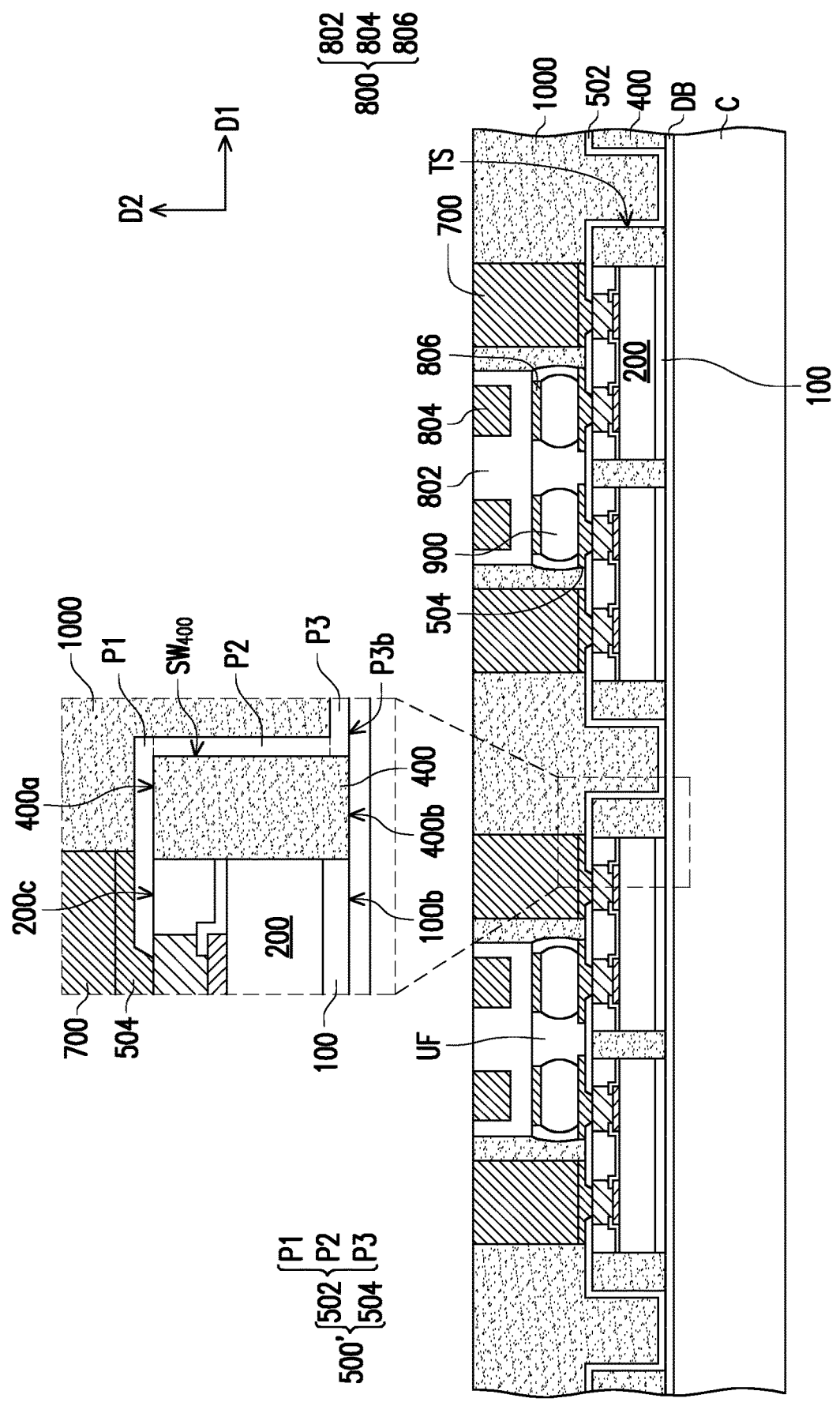

Referring to FIG. 3C, a second encapsulant 1000 is formed over the first redistribution structure 500' to encapsulate the conductive structures 700 and the second dies 800. In some embodiments, the material and the formation method of the second encapsulant 1000 may be similar to the first encapsulant 200 in FIG. 1E, so the detailed description thereof is omitted herein. As illustrated in FIG. 3C, top surfaces of the conductive structures 700, top surfaces of the conductive pads 804 of the second dies 800, and a top surface of the second encapsulant 1000 are coplanar. In some embodiments, the second encapsulant 1000 is filled into the through slot TS such that a portion of the dielectric layer 502 is located between the first encapsulant 400 and the second encapsulant 1000. In some embodiments, a material of the second encapsulant 1000 is different from the material of the dielectric layer 502.

In some embodiments, the dielectric layer 502 of the first redistribution structure 500' may be divided into a first portion P1, a second portion P2, and a third portion P3 connected to each other. For example, the second portion P2 connects the first portion P1 and the third portion P3. The first portion P1 and the third portion P3 extend along a first direction D1. For example, the first portion P1 may be parallel to the third portion P3. On the other hand, the second portion P2 extend along a second direction D2 substantially perpendicular to the first direction D1. In other words, the second portion P2 is substantially perpendicular to the first portion P1 and the third portion P3. As illustrated in FIG. 3C, the first portion P covers the active surfaces 200$c$ of the first dies 200 and the top surface 400$a$ of the first encapsulant 400. On the other hand, the second portion P2 covers the sidewalls SW$_{400}$ of the first encapsulant 400. In some embodiments, the first portion P1 and the second portion P2 of the dielectric layer 502 is sandwiched between the first encapsulant 400 and the second encapsulant 1000. In some embodiments, a bottom surface P3$b$ of the third portion P3 of the dielectric layer 502, the bottom surface 400$b$ of the first encapsulant 400, and the bottom surface 100$b$ of the adhesive layer 100 are coplanar.

Figure 3D:
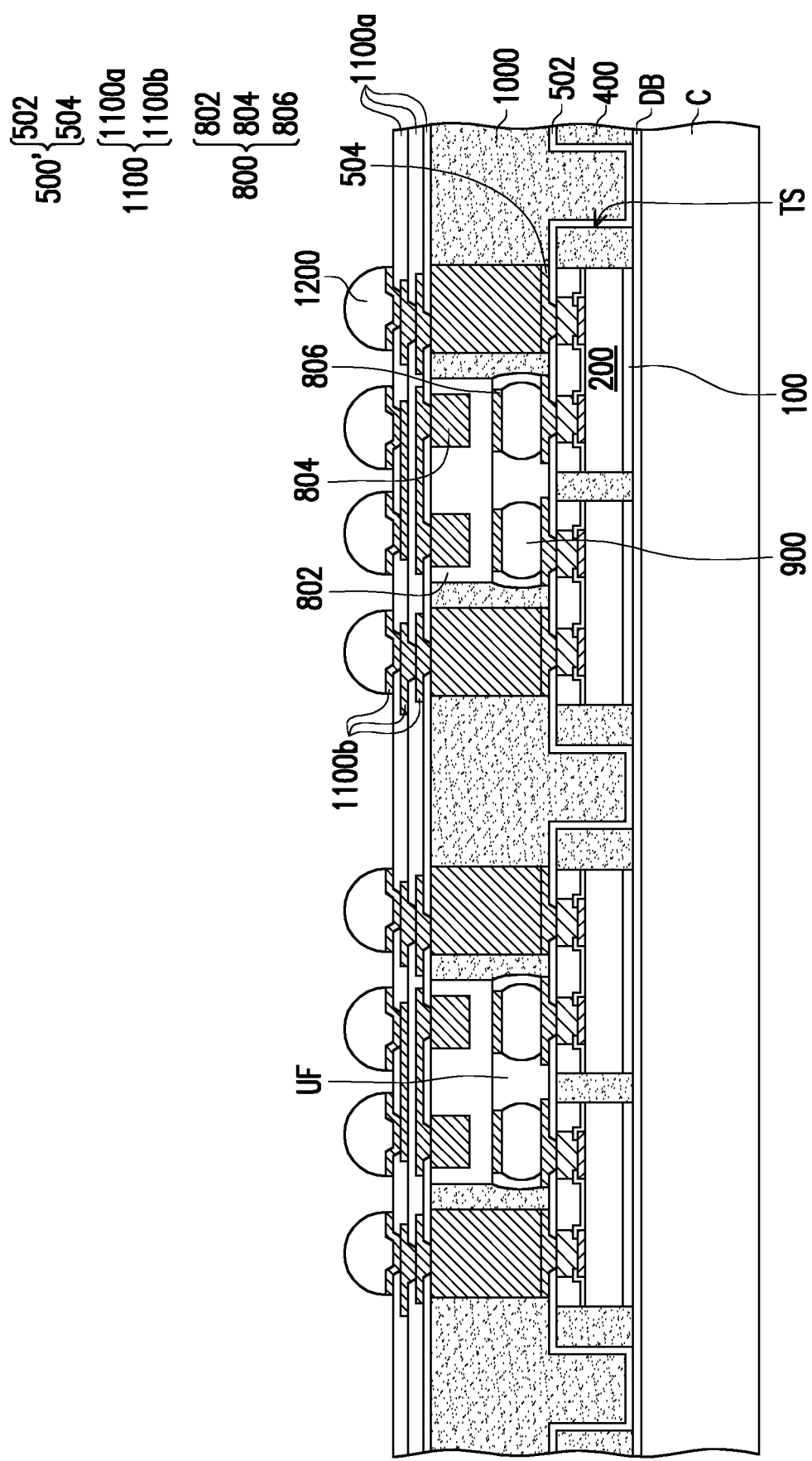

Referring to FIG. 3D, a second redistribution structure 1100 is formed over the conductive structures 700, the second dies 800, and the second encapsulant 1000. The second redistribution structure 1100 includes a plurality of dielectric layers 1100$a$ and a plurality of redistribution conductive patterns 1100$b$ stacked alternately. The second redistribution structure 1100 may be similar to the redistribution structure 500 illustrated in FIG. 1J, so the detailed description thereof is omitted herein. As illustrated in FIG. 3D, the redistribution conductive patterns 1100$b$ are electrically connected to the conductive pads 804 of the second dies 800 and the conductive structures 700 embedded in the second encapsulant 1000. In some embodiments, the bottommost dielectric layer 1100$a$ partially covers the top surfaces of the conductive pads 804 and the top surfaces of the conductive structures 700 to form a plurality of contact openings. The bottommost redistribution conductive patterns 1100$b$ extend into the contact openings of the bottommost dielectric layer 1100$a$ to be in physical contact with the top surfaces of the conductive pads 804 and the top surfaces of the conductive structures 700. In some embodiments, the second redistribution structure 1100 is electrically connected to the conductive structures 700 and the second dies 800. As such, the conductive structures 700 may electrically connect the first dies 200 and the second redistribution structure 1100.

In some embodiments, the topmost redistribution conductive patterns 1100$b$ include a plurality of under-ball metallurgy (UBM) patterns for ball mount. For example, a plurality of conductive terminals 1200 is formed over the UBM patterns of the second redistribution structure 1100. In some embodiments, the conductive terminals 1200 are attached to the UBM patterns through a solder flux. In some embodiments, the conductive terminals 1200 are, for example, solder balls. In some embodiments, the conductive terminals 1200 may be disposed on the second redistribution structure 1100 through a ball placement process and/or a reflow process. In some embodiments, other than the conductive terminals 1200, a plurality of passive device (not shown) may also be placed on the second redistribution structure 1200. For example, the topmost conductive patterns 1100b may further include a plurality of connection pads for mounting passive components. The passive device includes, for example, resistors, capacitors, inductors, or the like. In some embodiments, the passive device may be electrically connected to the second redistribution structure 1100 through a plurality of solder joints disposed therebetween.

Figure 3E:
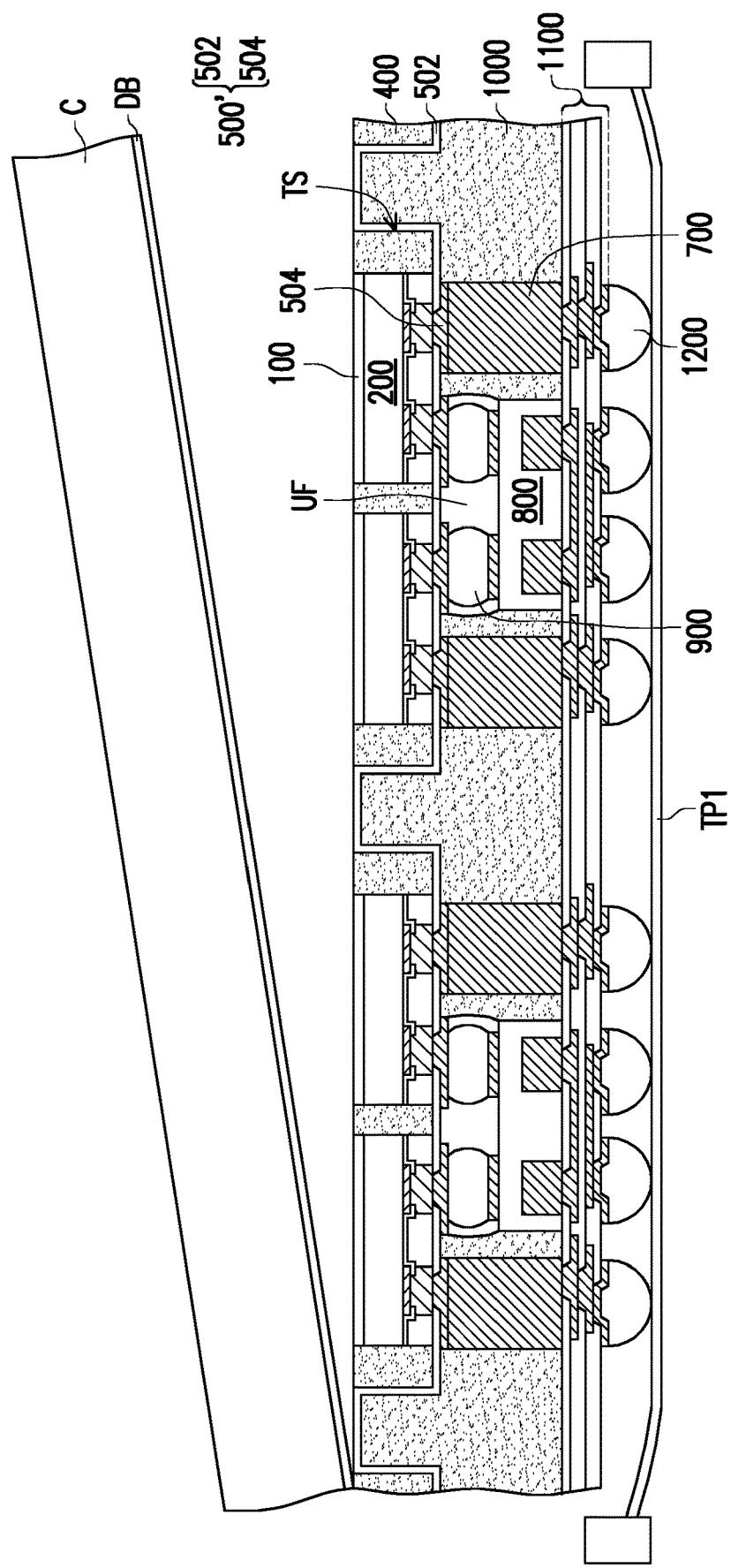

Referring to FIG. 3E, the structure illustrated in FIG. 3D is flipped upside down and is placed on a tape TP1. Subsequently, the carrier C and the de-bonding layer DB are removed from the adhesive layer 100, the first encapsulant 400, and the first redistribution structure 500'. In some embodiments, the de-bonding layer DB (e.g., the LTHC release layer) may be irradiated by an UV laser such that the carrier C and the de-bonding layer DB may be peeled off from the adhesive layer 100, the first encapsulant 400, and the dielectric layer 502 of the first redistribution structure 500'. However, the de-bonding process is not limited thereto. Other suitable de-carrier methods may be used in some alternative embodiments.

Figure 3F:
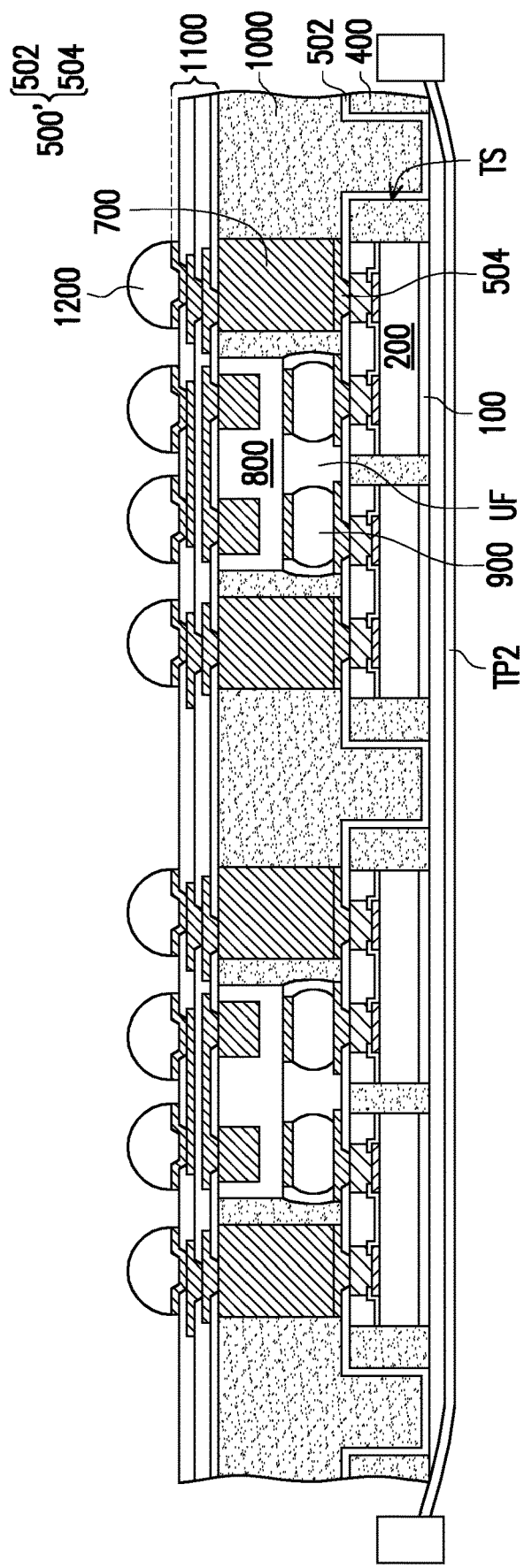

Referring to FIG. 3F, the structure illustrated in FIG. 3E is flipped upside down and is placed on a tape TP2 for further processing. For example, a cleaning process may be performed to remove impurities or residues derived from previous process steps.

Figure 3G:
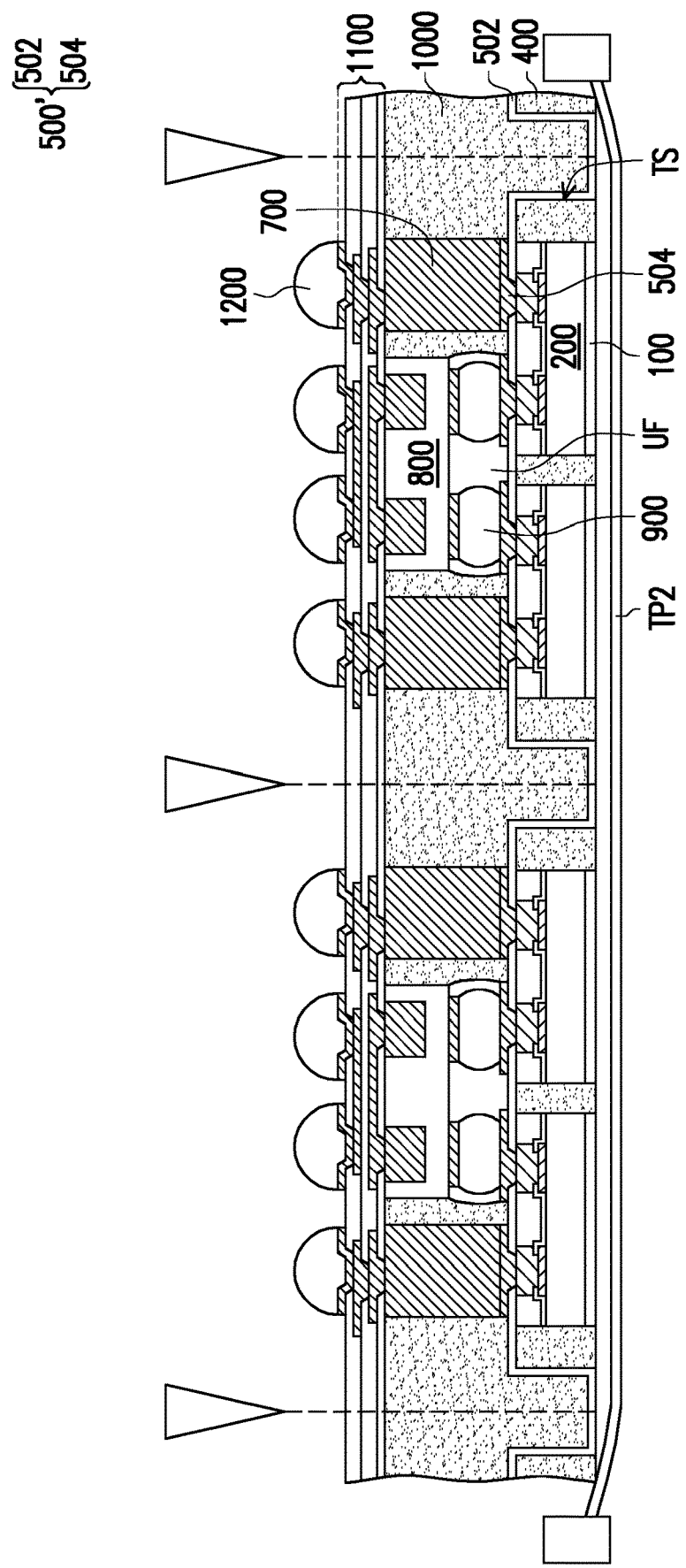

Referring to FIG. 3G, a singulation process is performed. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, the scribe line for singulation may be located within the through slot TS of the first encapsulant 400. For example, during the singulation process, the rotating blade or the laser beam may cut through the second encapsulant 1000 and the dielectric layer 502 located in the through slot TS. Although FIG. 3G illustrated that the dicing is performed at the center of the through slot TS, the disclosure is not limited thereto. In some alternative embodiments, the dicing may be performed at any position located between one sidewall of the through slot TS and the center of the through slot TS.

Figure 3H:
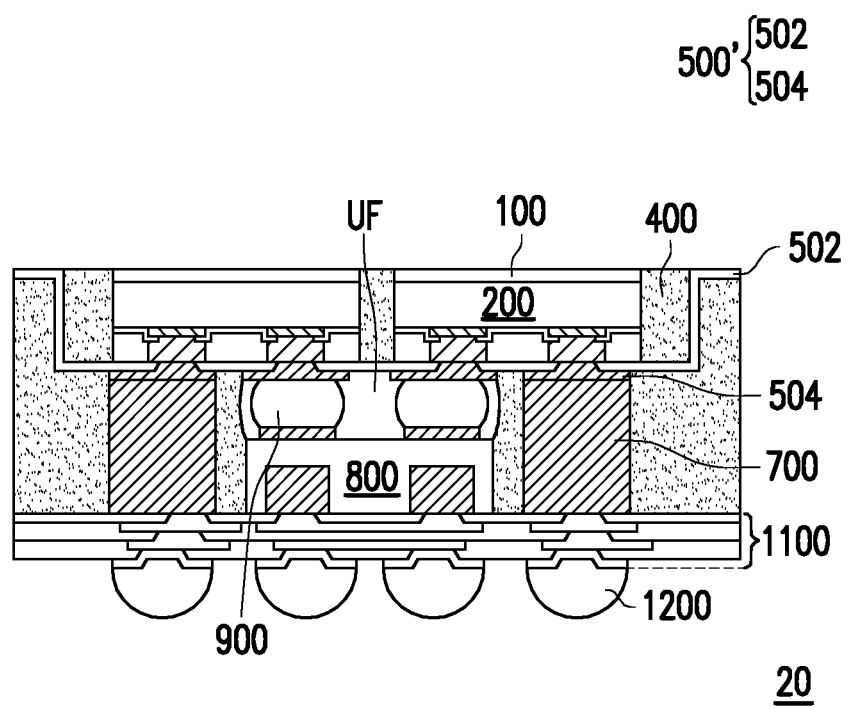

Referring to FIG. 3H, after the singulation process, a plurality of package structures 20 are obtained. In some embodiments, the package structure 20 may be referred to as an integrated fan-out (InFO) package.

In accordance with some embodiments of the disclosure, a package structure includes a plurality of first dies, a first encapsulant, and a first redistribution structure. The first encapsulant encapsulates the first dies. The first redistribution structure is disposed on the first dies and the first encapsulant. The first redistribution structure includes a dielectric layer covering a top surface and sidewalls of the first encapsulant.

In accordance with some alternative embodiments of the disclosure, a package structure includes a plurality of first dies, a first encapsulant, a dielectric layer, a second die, and a second encapsulant. Each first die has an active surface and a rear surface opposite to the active surface. The first encapsulant encapsulates the first dies. The dielectric layer is disposed on the first dies and the first encapsulant. The dielectric layer includes a first portion and a second portion connected to each other. The first portion extends along a first direction. The second portion extends along a second direction substantially perpendicular to the first direction. The first portion covers the active surfaces of the first dies and a top surface of the first encapsulant. The second portion covers sidewalls of the first encapsulant. The second die is disposed over the dielectric layer. The second encapsulant encapsulates the second die.

In accordance with some embodiments of the disclosure, a manufacturing method of a package structure includes at least the following steps. A carrier is provided. A plurality of first dies is placed on the carrier. A polymeric structure is printed on the carrier. The polymeric structure surrounds the first dies. The first dies and the polymeric structure are encapsulated by a first encapsulant. The polymeric structure is removed to form a through slot in the first encapsulant. A first redistribution structure is formed over the first dies and the first encapsulant. The step of forming the first redistribution structure at least includes conformally forming a dielectric layer filled into the through slot of the first encapsulant to cover sidewalls of the through slot.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a plurality of first dies;
   a first encapsulant encapsulating the plurality of first dies; and
   a first redistribution structure disposed on the plurality of first dies and the first encapsulant, wherein the first distribution structure comprises a dielectric layer covering a top surface and sidewalls of the first encapsulant.

2. The package structure according to claim 1, wherein a material of the dielectric layer is different from a material of the first encapsulant.

3. The package structure according to claim 2, wherein the material of the dielectric layer is free of filler.

4. The package structure according to claim 2, wherein the material of the dielectric layer comprises polyimide, polybenzoxazole, epoxy-based materials, or acrylic-based materials.

5. The package structure according to claim 1, further comprising:
   a second die disposed over the first redistribution structure;
   a plurality of conductive structures surrounding the second die; and
   a second encapsulant encapsulating the second die and the plurality of conductive structures, wherein the dielectric layer is located between the first encapsulant and the second encapsulant.

6. The package structure according to claim 5, further comprising:
   a second redistribution structure disposed over the second die, the plurality of conductive structures, and the second encapsulant; and a plurality of conductive terminals disposed over the second redistribution structure.

7. The package structure according to claim 5, further comprising an underfill layer sandwiched between the second die and the first redistribution structure.

8. A package structure, comprising:
a plurality of first dies, each first die has an active surface and a rear surface opposite to the active surface;
a first encapsulant encapsulating the plurality of first dies;
a dielectric layer disposed on the plurality of first dies and the first encapsulant, wherein the dielectric layer comprises a first portion and a second portion connected to each other, the first portion extends along a first direction, the second portion extends along a second direction substantially perpendicular to the first direction, the first portion covers the active surfaces of the plurality of first dies and a top surface of the first encapsulant, and the second portion covers sidewalls of the first encapsulant;
a second die disposed over the dielectric layer; and
a second encapsulant encapsulating the second die.

9. The package structure according to claim 8, further comprising:
a redistribution structure disposed over the second die; and
a plurality of conductive terminals disposed on the redistribution structure.

10. The package structure according to claim 9, further comprising a plurality of conductive structures surrounding the second die, wherein the plurality of conductive structures electrically connects the plurality of first dies and the redistribution structure.

11. The package structure according to claim 8, wherein the first portion and the second portion of the dielectric layer are sandwiched between the first encapsulant and the second encapsulant.

12. The package structure according to claim 8, further comprising an adhesive layer attached to the rear surfaces of the plurality of first dies, and a bottom surface of the adhesive layer is coplanar with a bottom surface of the first encapsulant.

13. The package structure according to claim 12, wherein the dielectric layer further comprises a third portion connected to the second portion, the third portion extends along the first direction, and a bottom surface of the third portion of the dielectric layer, the bottom surface of the first encapsulant, and the bottom surface of the adhesive layer are coplanar.

14. A manufacturing method of a package structure, comprising:
providing a carrier;
placing a plurality of first dies on the carrier;
printing a polymeric structure on the carrier, wherein the polymeric structure surrounds the plurality of first dies;
encapsulating the plurality of first dies and the polymeric structure by a first encapsulant;
removing the polymeric structure to form a through slot in the first encapsulant; and
forming a first redistribution structure over the plurality of first dies and the first encapsulant, comprising:
conformally forming a dielectric layer filled into the through slot of the first encapsulant to cover sidewalls of the through slot.

15. The method according to claim 14, wherein the polymeric structure comprises acrylic-based materials.

16. The method according to claim 14, wherein the polymeric structure is removed through an etching process or a laser drilling process.

17. The method according to claim 14, further comprising:
forming a plurality of second dies and a plurality of conductive structures over the first redistribution structure;
forming a second encapsulant over the first redistribution structure to encapsulate the plurality of second dies and the plurality of conductive structures, wherein the second encapsulant fills into the through slot of the first encapsulant;
forming a second redistribution structure over the second encapsulant, the plurality of second dies, and the plurality of conductive structures; and
forming a plurality of conductive terminals over the second redistribution structure.

18. The method according to claim 17, further comprising forming an underfill layer between the plurality of second dies and the first redistribution structure.

19. The method according to claim 14, further comprising performing a singulation process, comprising:
cutting through the dielectric layer located in the through slot of the first encapsulant.

20. The method according to claim 14, wherein the step of encapsulating the plurality of first dies and the polymeric structure comprises:
forming a first encapsulation material over the carrier to cover the plurality of first dies and the polymeric structure, wherein a thickness of the first encapsulation material is greater than a thickness of the plurality of first dies and a thickness of the polymeric structure; and
removing a portion of the first encapsulation material to expose the plurality of first dies and the polymeric structure, so as to form the first encapsulant.

* * * * *